(12) United States Patent
Tual et al.

(10) Patent No.: US 10,748,679 B2
(45) Date of Patent: Aug. 18, 2020

(54) POWER RESISTOR

(71) Applicant: Yazaki Europe Limited, Hemel Hempstead, Hertfordshire (GB)

(72) Inventors: Frederic Tual, Hemel Hempstead (GB); Mickael Churet, Hemel Hempstead (GB); Alan Plant, Hemel Hempstead (GB); Adam Neal, Hemel Hempstead (GB)

(73) Assignee: Yazaki Europe Limited, Hemel Hempstead, Hertfordshire (GB)

( * ) Notice: Subject to any disclaimer, the term of this patent is extended or adjusted under 35 U.S.C. 154(b) by 0 days.

(21) Appl. No.: 16/608,026

(22) PCT Filed: Apr. 24, 2018

(86) PCT No.: PCT/EP2018/060490
§ 371 (c)(1),
(2) Date: Oct. 24, 2019

(87) PCT Pub. No.: WO2018/197504
PCT Pub. Date: Nov. 1, 2018

(65) Prior Publication Data
US 2020/0194148 A1 Jun. 18, 2020

(30) Foreign Application Priority Data

Apr. 25, 2017 (EP) .................................... 17167882

(51) Int. Cl.
*H01C 3/10* (2006.01)
*H01C 1/01* (2006.01)
(Continued)

(52) U.S. Cl.
CPC ............... *H01C 3/10* (2013.01); *G01R 1/203* (2013.01); *H01C 1/01* (2013.01); *H01C 17/006* (2013.01); *H05K 3/341* (2013.01)

(58) Field of Classification Search
CPC .......... H01C 3/10; H01C 1/01; H01C 17/006; G01R 1/203; H05K 3/341
(Continued)

(56) References Cited

U.S. PATENT DOCUMENTS 3,697,923 A * 10/1972 Griffes ..................... H01C 3/10
 338/280
4,211,934 A * 7/1980 Henle ................ G01R 19/0092
 307/100
(Continued)

FOREIGN PATENT DOCUMENTS

| DE | 37 41 525 A1 | 6/1989 |
| EP | 2 274 749 A1 | 1/2011 |
| GB | 2 070 862 A | 9/1981 |

OTHER PUBLICATIONS

International Search Report dated May 16 2018, in International Application No. PCT/EP2018/060490; Filed: Apr. 24, 2018; Applicant: Yazaki Europe Limited.
(Continued)

*Primary Examiner* — Sherman Ng
(74) *Attorney, Agent, or Firm* — Erise IP, P.A.

(57) ABSTRACT

A power resistor for use in an automotive battery diagnosis circuit. The resistor includes a length of conductive material stamped to form a ribbon, which has formed along its length pins arranged perpendicular to the length of the ribbon and in a plane perpendicular to the stamping direction. The pins are arranged to provide in use means for electrical connection and mechanical fixation to the circuit.

13 Claims, 3 Drawing Sheets

(51) Int. Cl.
*H05K 3/34* (2006.01)
*H01C 17/00* (2006.01)
*G01R 1/20* (2006.01)

(58) Field of Classification Search
USPC .......................... 174/260; 338/279, 280, 287
See application file for complete search history.

(56) References Cited

U.S. PATENT DOCUMENTS

| | | | | |
|---|---|---|---|---|
| 4,317,104 | A | | 2/1982 | Bergmann et al. |
| 4,553,126 | A | * | 11/1985 | Brandstater .............. H05B 3/24 |
| | | | | 219/532 |
| 4,617,548 | A | * | 10/1986 | Buchwald, Jr. ........ G01R 1/203 |
| | | | | 219/541 |
| 5,214,407 | A | * | 5/1993 | McKim, Jr. ............ G01R 1/203 |
| | | | | 338/120 |
| 5,218,334 | A | * | 6/1993 | Bartlett .................... H01C 3/02 |
| | | | | 338/206 |
| 6,069,553 | A | * | 5/2000 | Black, III .............. H01C 1/084 |
| | | | | 338/185 |
| 2019/0029133 | A1 | * | 1/2019 | Schramme .......... H01M 10/425 |

OTHER PUBLICATIONS

Written Opinion of the International Searching Authority dated May 16, 2018, in International Application No. PCT/EP2018/060490; Filed: Apr. 24, 2018; Applicant: Yazaki Europe Limited.

* cited by examiner

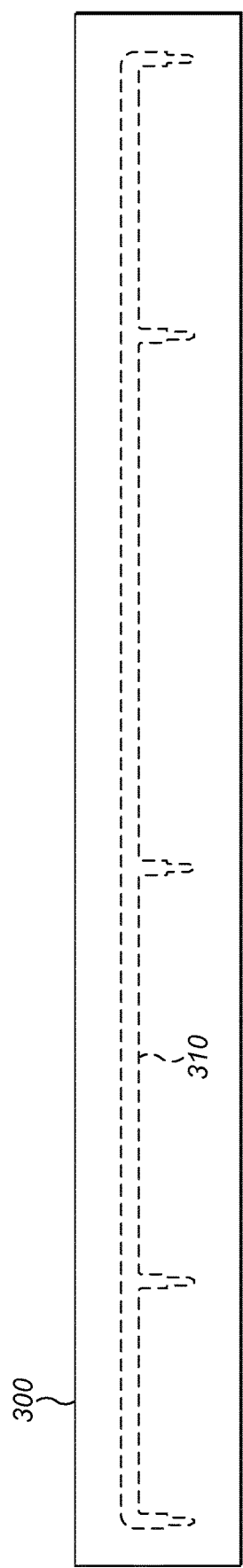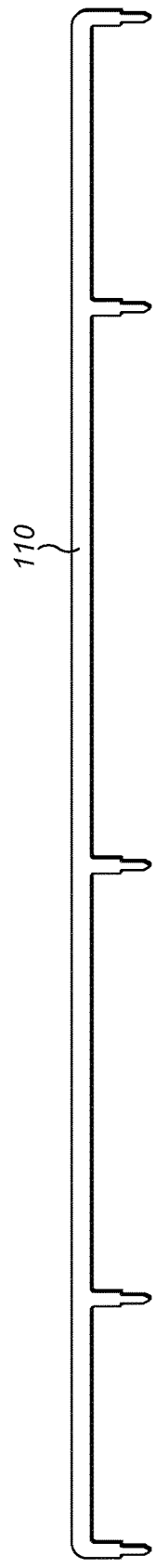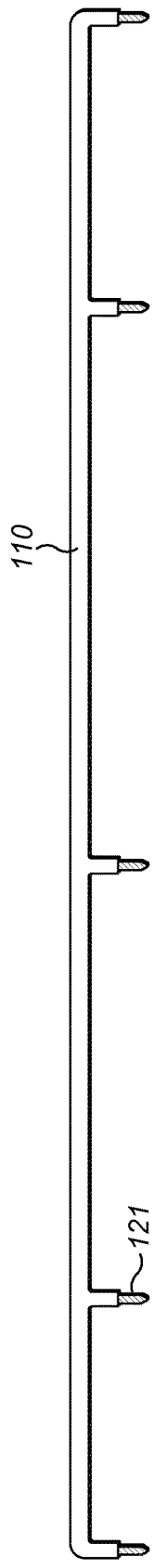

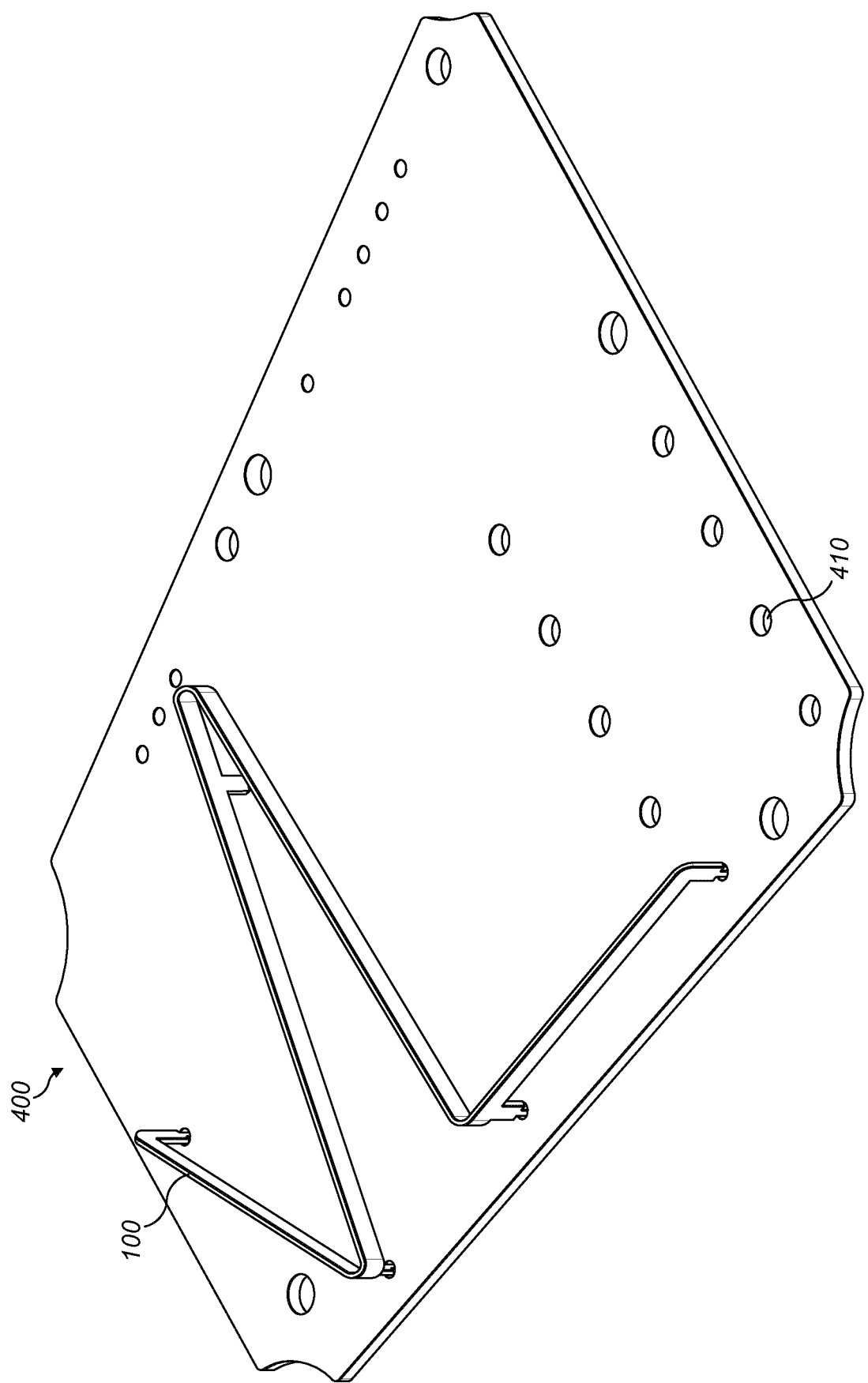

POWER RESISTOR

RELATED APPLICATIONS

The present application is a national stage application under 35 U.S.C. § 371 of International Application No. PCT/EP2018/060490, filed 24 Apr. 2018, which claims priority to European Patent Application No. 17167882.4, filed 25 Apr. 2017. The above referenced applications are hereby incorporated by reference into the present application in their entirety.

The present invention relates to a power resistor of the type used in circuits for performing diagnostics on batteries in automotive electrical systems.

Many modern automobiles are equipped with a stop-start system which seeks to reduce the amount of time the engine spends idling and to thereby reduce fuel consumption and emissions. The stop-start system automatically shuts down the internal combustion engine when the vehicle is stationary and restarts the engine when the vehicle is ready to move off again. Due to the increased number of stop-start cycles performed, vehicles with such systems installed are heavily reliant on the on-board automotive battery.

In start-stop systems and other fuel optimisation strategies relying on the availability of the battery, it is therefore important to ensure that the health and charge of the battery is maintained, and as such the battery must be tested on a regular basis. The battery may be dynamically tested while the vehicle is in operation; for example, to check at regular intervals whether the battery would be able to restart the engine or in case of an alternator failure during motion.

A diagnostic circuit may be installed in the automotive electrical system in order to perform regular checks on the battery. Typically, such a circuit contains a power resistor through which a current from the battery is allowed to flow, and by measuring the current through the resistor together with the battery voltage it is possible to evaluate battery electrical parameters. The performance of such a diagnostic circuit depends on the choice of power resistor, and its ability to handle high current pulses.

Surface mountable high current resistors are known but many are not suitable for use in automotive battery diagnostic circuits. In particular, surface mounted technology is unsuitable for high-power or high-voltage parts in power circuitry as required in an automotive battery diagnostic circuit.

One device known in the art is a resistor stamped from conductive sheet material, usually steel, comprising slits which form the sheet into an "S" shape. At each end portion of the "S" there are holes through which the resistor may be bolted on to terminals for electrical connection. A significant disadvantage of employing a bolt-on connection is that the bolt occupies a large portion of space on a circuit board which often means the resistor is required to be housed in an outside box and operated as a separate unit. It also often requires manual intervention during manufacture. This is expensive in terms of both cost and space, and is thus unsuitable for use in an automotive battery diagnostic system. Moreover, a pre-determined pattern must be stamped on a limited area which means that the manufacture process is inflexible, as the resistor cannot easily be altered if for example the geometry of the circuit were to be modified.

There is therefore a need for a power resistor capable of handling high current pulses that is low cost, simple to manufacture and integrate with other circuitry using standard processes, and allows for flexibility in the design and manufacture process.

SUMMARY OF INVENTION

The present invention seeks to provide a power resistor for use in an automotive battery diagnosis circuit, the power resistor being cheap and simple to manufacture, easy to integrate to the circuit with standard processes and allows for flexibility in the design and manufacture process.

According to the present invention, there is provided a power resistor for use in an automotive battery diagnosis circuit comprising a length of conductive material stamped to form a ribbon, the ribbon having formed along its length pins arranged perpendicular to the length of the ribbon and in a plane perpendicular to the stamping direction, the pins arranged to provide, in use, means for electrical connection and mechanical fixation to the circuit.

By having the pins formed as part of the stamping process it is possible to reliably produce a power resistor with means for mechanical fixation and electrical connection to a printed circuit board in a simple operation. In addition, by having the resistor in the form of a ribbon which may be cut and formed to suit any configuration on a circuit board there is provided flexibility in design and manufacture of the battery diagnostic circuit.

According to another aspect of the present invention there is provided a method of manufacturing a power resistor for use in an automotive battery diagnosis circuit, the method comprising stamping a length of conductive material to form a ribbon, the ribbon having formed along its length pins arranged perpendicular to the length of the ribbon and in a plane perpendicular to the stamping direction.

Since the ribbon may be stamped from a reel of conductive material, it is possible to operate this process continuously as part of a moving reel-to-reel process such that the manufacturing may be completely automated. In addition, as the power resistor is easily integrated onto a printed circuit board with standard automatable processes such as wave soldering, it is possible to further automate mounting of the resistor to a circuit as part of a continuous reel-to-reel production.

BRIEF DESCRIPTION OF THE DRAWINGS

The invention will now be described by way of example with reference to the accompanying drawings, in which:

FIG. 3A schematically illustrates a portion of conductive material from which the power resistor of FIG. 1 may be stamped.

FIG. 3B schematically illustrates the portion of conductive material of FIG. 3A after stamping.

FIG. 3C schematically illustrates the stamping of FIG. 3B with plating applied.

FIG. 4 schematically illustrates how the power resistor of FIG. 1 may be installed on a printed circuit board.

DETAILED DESCRIPTION

Figure 1:
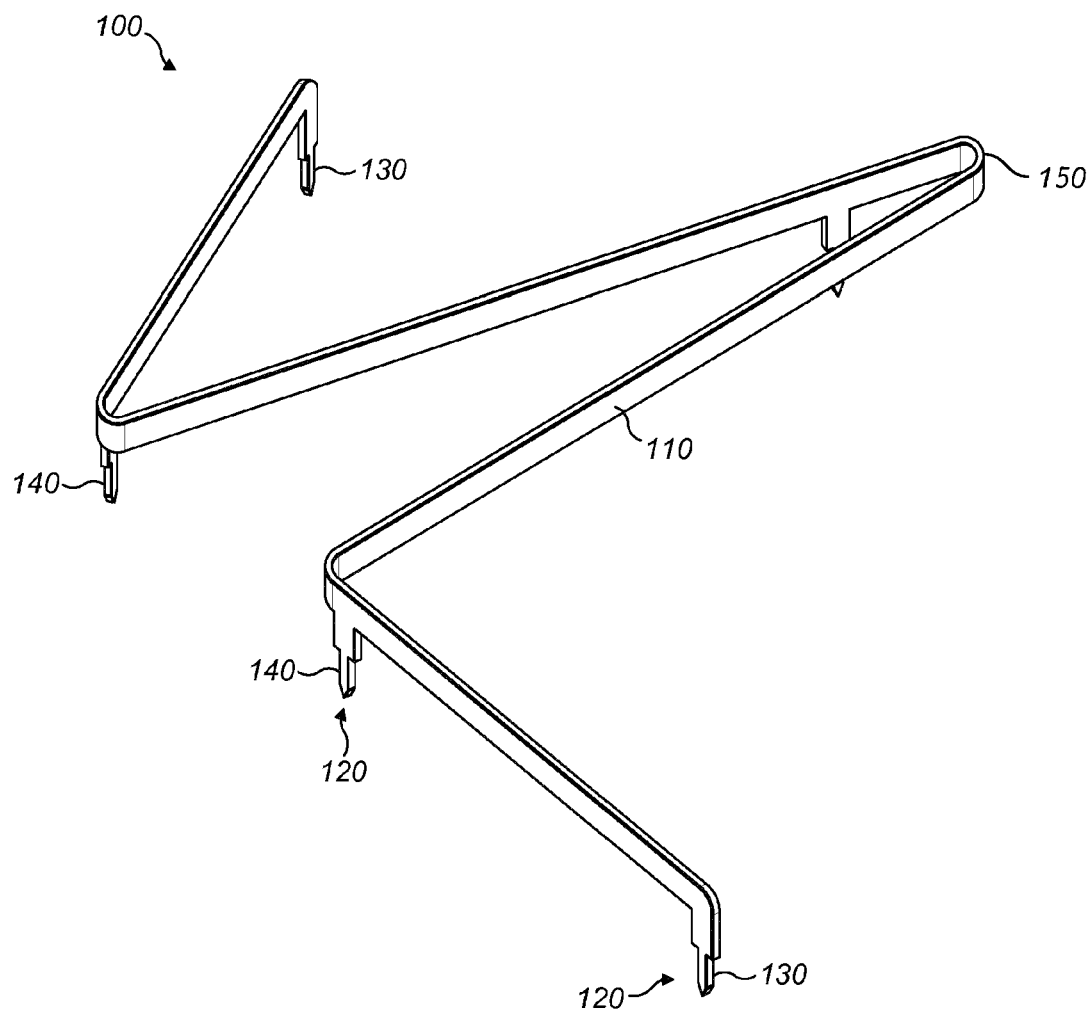
FIG. 1 schematically illustrates a power resistor for use in an automotive battery diagnosis circuit according to an example of the invention.

FIG. 1 schematically illustrates a power resistor 100 for use in an automotive battery diagnosis circuit according to an example of the invention. The power resistor 100 comprises a ribbon 110 and pins 120, stamped from a length of conductive material. The pins 120 are arranged in a plane perpendicular to the direction of stamping and perpendicular to the length of the ribbon 110, and provide, in use, means for mechanical and electrical connection to a printed circuit board. In this example, two terminal pins 130 provide the electrical connection to a circuit board such that electrical current flows through the ribbon 110 between the terminal pins 130. Support pins 140 provide means for mechanical fixation to a circuit board. Although in FIG. 1 the terminal pins 130 are shown to be at the extremities of the ribbon, the pins 120 may be arranged in any configuration and at any position along the length of the ribbon 110. The power resistor 100 can comprise any number of terminal pins 130, so as to provide multiple points of connection to a circuit, or multiple components of a circuit.

In this example, the ribbon 110 further comprises vertices 150 where the ribbon 110 has been bent in order to fit the layout of a circuit board to which the power resistor 100 is to be mounted. The ribbon 110 has been bent in a direction which is perpendicular to the longitudinal direction of the ribbon 110. The bending direction is also perpendicular to the direction of the pins 120, that is, the direction in which the pins protrude away from the ribbon. The axis of the bending is therefore different to the longitudinal axis of the pins 120 and to the longitudinal axis of the ribbon 110. By bending the ribbon 110 in a third axis different from the longitudinal axis of the ribbon 110 and the longitudinal axis of the pins 120, the power resistor 100 takes a three-dimensional form or configuration which allows, for example, an easier integration of the resistor 100 to a PCB and different resistive properties. The number of vertices 150 of the ribbon 110 can be increased to provide multiple points of bending and produce a power resistor 100 with a smaller form factor, thereby reducing the distance from one terminal pin 140 to another while maintaining the desired resistive or thermal properties.

In some examples, the bending direction is the same as the direction in which the ribbon 110 is stamped from a sheet of conductive material. In such an example, the ribbon 110 can be bent with the application of a force which is substantially the same direction as the force which is applied to stamp the ribbon 110.

In some examples, the ribbon is bent so as to form protrusions which provide secondary or further points of contact to a circuit or a portion of a circuit board, with a similar function as that of the pins 120.

The power resistor 100 may be manufactured from any conductive material suitable for use in a circuit with bursts of high current. For example, the power resistor 100 may be manufactured from steel. The ribbon 110 may be of any length and thickness. As the length and thickness of the ribbon 110 defines its resistance, the length and thickness of conductive material stamped is typically chosen to suit the requirements of the battery diagnosis circuit in which it is employed. While the ribbon 110 may have any length chosen to provide a particular value of resistance, by bending the ribbon as shown in FIG. 1 at the vertices 150 it is possible to easily adapt the resistor to fit the requirements of the circuit board in which it is implemented, resulting in a compact and easy to mount PCB power load.

Figure 2:
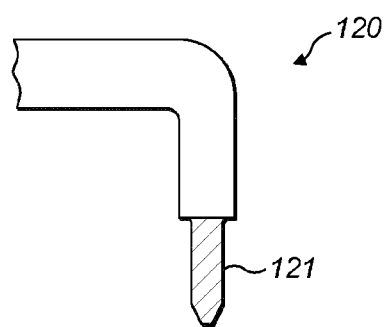
FIG. 2 schematically illustrates an example of a pin on the power resistor of FIG. 1.

FIG. 2 schematically illustrates an example of a pin 120 on the power resistor 100 of FIG. 1. In this example, the connective region 121 of the pin is plated to increase reliability and improve the quality of the electrical connection to the circuit. The region 121 may be plated with a single or any combination of layers of copper plating, tin plating, and nickel plating, for example.

FIG. 3A schematically illustrates a portion of conductive material from which a power resistor 100 may be stamped. The conductive material may be prepared as a single sheet or as a reel such that the power resistor 100 may be produced as part of a continuous reel-to-reel process. In this example, a reel of conductive material 300 is shown with a dashed line 310 which represents the outline of the ribbon 110 and pins 120. The direction of stamping is perpendicular to the plane containing the ribbon and the pins.

In the case of production by reel-to-reel processing, a continuous reel of conductive material may be passed through a stamping machine to form successive power resistors as part of a moving production line, for example. Further, the resistor is stamped and bent by the application of stamping and bending forces, which can be applied as part of the reel-to-reel process. As described above, the stamping force and bending force in one example is applied in substantially the same direction with respect to the plane containing the ribbon and the pins.

FIG. 3B schematically illustrates an example of a power resistor 100 stamped from the reel of conductive material of FIG. 3A. The length of the ribbon 110 is easily changed by altering the stamping length and as such the resistance of the power resistor 100 can easily be configured.

FIG. 3C schematically illustrates the power resistor of FIG. 3B with plating applied to the pins 120. As discussed above, the plating may comprise a single or any combination of layers of copper plating, tin playing and nickel plating, for example. Preferably, the application of plating is also part of the automated reel-to-reel process.

Once the pins have been plated, the power resistor 100 may be bent and formed to any shape to accommodate the layout of the printed circuit board to which it may be mounted. Preferably, the bending and forming is performed by a bending machine as part of the reel-to-reel process. With the power resistor 100 formed in the desired shape, as for example shown in FIG. 1, it may be additionally coated before being installed in a printed circuit board.

The use of reel-to-reel processing has many benefits. One advantage is that the process may be completely automated which reduces costs and leads to increased part reliability. Another advantage is that, since the ribbon 110 is formed from a continuous piece of conductive material, its length is very easily varied during manufacture. Once the ribbon 110 has been stamped and pins 120 plated, the resistor 100 may then be passed to a bending machine to form a desired shape. This provides great flexibility in design and manufacture since the power resistor 100 can be formed at the last stage of the manufacturing process in any shape to accommodate the layout of the printed circuit board, and consequently make a more compact automotive battery diagnostic unit.

FIG. 4 schematically illustrates how the power resistor of FIG. 1 may be installed on a printed circuit board 400. In this example, the circuit board 400 comprises holes 410 through which circuit components may be mounted. In this example, the power resistor 100 is moved onto the printed circuit board 400 by movement in a single direction and through-hole mounted by fixing the pins 120 through the holes 410 on the circuit board 400. In addition to providing points of inflection of the ribbon 110, the vertices 150 further provide a region of increased rigidity. The power resistor 100 may therefore be installed on the circuit board 400 by applying a downward force at the vertices 150 to mount the pins 120 through holes 410.

Once all other components have been placed on the board, the resistor together with all other components may be permanently integrated to the circuit using standard processes. For example, the circuit board 400 may be passed through a wave-soldering machine. Alternatively, the pins 120 may be mounted by press-fit to the holes 410.

With the ability to move the power resistor 100 onto the printed circuit board by movement in a single direction to place the pins 120 through the holes 410, it is possible to further integrate the process of mounting the resistor as part of an automated production process. It is therefore possible to automate the entire process of manufacturing the resistor and installing to a printed circuit board.

The invention claimed is:

1. A power resistor for use in an automotive battery diagnosis circuit comprising:
   a length of conductive material stamped to form a ribbon;
   the ribbon having formed along its length pins arranged perpendicular to the length of the ribbon and in a plane perpendicular to the stamping direction, the pins arranged to provide in use means for electrical connection and mechanical fixation to the circuit;
   the ribbon being bent at one or more positions along the length of the ribbon to form one or more vertices, wherein the ribbon is bent at the vertices in a direction perpendicular to the plane containing the ribbon and the pins,
   wherein the pins are formed at an extremity of the resistor and at vertices of the resistor.

2. The power resistor according to claim 1 wherein the pins are plated with one or more of copper plating, tin plating and nickel plating.

3. The power resistor according to claim 1 arranged to be mounted on a printed circuit board by wave soldering.

4. The power resistor according claim 1 arranged to be mounted on a printed circuit board by press-fit fixation.

5. A circuit for performing a diagnostic of an automotive battery comprising:
   a printed circuit board;
   a length of conductive material stamped to form a ribbon;
   the ribbon having formed along its length pins arranged perpendicular to the length of the ribbon and in a plane perpendicular to the stamping direction, the pins arranged to provide in use means for electrical connection and mechanical fixation to the printed circuit board;
   the ribbon being bent at one or more positions along the length of the ribbon to form one or more vertices, wherein the ribbon is bent at the vertices in a direction perpendicular to the plane containing the ribbon and the pins,
   wherein the pins are formed at an extremity of the resistor and at vertices of the resistor.

6. A method of manufacturing a power resistor for use in an automotive battery diagnosis circuit, the circuit having a printed circuit board, the method comprising:
   stamping a length of conductive metal to form a ribbon,
      the ribbon having formed along its length pins arranged perpendicular to the length of the ribbon and in a plane perpendicular to the stamping direction,
      the pins arranged to provide in use means for electrical connection and mechanical fixation to the printed circuit board,
      the ribbon being bent at one or more positions along the length of the ribbon to form one or more vertices, wherein the ribbon is bent at the vertices in a direction perpendicular to the plane containing the ribbon and the pins,
      wherein the pins are formed at an extremity of the resistor and at vertices of the resistor.

7. The method according to claim 6 further comprising the step of plating the pins, the plating comprising one or more of copper plating, tin plating and nickel plating.

8. The method according to claim 6 further comprising the step of cutting and forming the ribbon.

9. The method according to claim 6 wherein the steps are carried out as part of a reel-to-reel process.

10. The method according to claim 6 further comprising the steps of:
    cutting and forming the ribbon to fit the available space on the printed circuit board; and
    through-hole mounting the resistor by fixing its pins through openings in the printed circuit board.

11. The method according to claim 10 wherein the ribbon is mounted to the printed circuit board by press-fit fixation.

12. The method according to claim 10 further comprising the step of wave soldering the pins to the printed circuit board.

13. The method according to claim 10 wherein the circuit of the power resistor is manufactured as part of a continuous reel-to-reel process.

* * * * *